(12) United States Patent
Guliani et al.

(10) Patent No.: US 6,366,497 B1
(45) Date of Patent: Apr. 2, 2002

(54) METHOD AND APPARATUS FOR LOW VOLTAGE SENSING IN FLASH MEMORIES

(75) Inventors: Sandeep Guliani; Chaitanya Rajguru, both of Folsom; Kedar Mangrulkar, Fair Oaks, all of CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/539,725

(22) Filed: Mar. 30, 2000

(51) Int. Cl.$^7$ .............................................. G11C 16/06
(52) U.S. Cl. .................... 365/185.21; 365/210
(58) Field of Search ........................ 365/185.21, 210, 365/205, 208, 207

(56) References Cited

U.S. PATENT DOCUMENTS 5,528,543 A * 6/1996 Stiegler ...................... 365/210
5,699,245 A * 12/1997 Yero .......................... 365/210
5,986,940 A * 11/1999 Atsumi et al. ............. 365/185.3
6,108,259 A * 8/2000 Choi et al. .................. 365/210

FOREIGN PATENT DOCUMENTS

EP  0 805 454 A1  11/1997
EP  0 814 483 A1  12/1997

* cited by examiner

*Primary Examiner*—Vu A. Le
(74) *Attorney, Agent, or Firm*—Blakely, Sokoloff, Taylor & Zafman LLP (57) ABSTRACT

In one embodiment, the invention is an apparatus. The apparatus includes a column load component and a current mirror coupled in parallel with the column load component. The column load component is capable of being coupled to a FLASH cell and a sense amplifier.

9 Claims, 6 Drawing Sheets

METHOD AND APPARATUS FOR LOW VOLTAGE SENSING IN FLASH MEMORIES

BACKGROUND OF THE INVENTION

1. Field of the Invention

The invention generally relates to sense amplifiers and more specifically relates to sense amplifiers in FLASH memory devices.

2. Description of the Related Art

Most memory technology employs sense amplifiers. These sense amplifiers are typically designed for low current inputs with high gain and rapid response times. However, memory technology also often involves selecting a particular cell and letting that cell pull a node down or up, to a different value from what the node is biased to when no cell is selected. That node is typically the input node of the sense amplifier. As a result, the fastest sense amplifier is of little use if the input node can only be pulled to a different voltage slowly by the memory cell.

One method for providing a memory cell that can rapidly pull a node up or down is to use a large transistor in the memory cell, thus allowing for high current which may pull the node to the desired voltage. However, the larger the transistor, the more space the memory cell requires, and therefore the lower the density of memory cells can be on a given memory chip. Furthermore, a larger transistor may have increased capacitive coupling effects which will lead to a slower transition from a non-conductive to a conductive state, resulting in a property of the larger transistor defeating the purpose of having the larger transistor.

SUMMARY OF THE INVENTION

In one embodiment, the invention is an apparatus. The apparatus includes a column load component and a current mirror coupled in parallel with the column load component. The column load component is capable of being coupled to a FLASH cell and a sense amplifier.

BRIEF DESCRIPTION OF THE DRAWINGS

The present invention is illustrated by way of example and not limitation in the accompanying figures.

DETAILED DESCRIPTION

A method and apparatus for low voltage sensing in flash memories is described. In the following description, for purposes of explanation, numerous specific details are set forth in order to provide a thorough understanding of the invention. It will be apparent, however, to one skilled in the art that the invention can be practiced without these specific details. In other instances, structures and devices are shown in block diagram form in order to avoid obscuring the invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment. Likewise, alternative or separate embodiments are not necessarily mutually exclusive of other embodiments.

The low voltage sensing in FLASH memories is carried out through use of a common mode current mirror (current source) and kicker circuitry in the sensing circuitry. The common mode current mirror provides current generally sufficient to satisfy the current drain from the bias network, and the kicker circuitry provides additional pullup current (charge) relative to the current supplied by the column load in the sensing circuitry. By providing both of these additional elements, the column load may be sized and designed as a more resistive load suitable for providing a significant voltage swing between a high and a low voltage on a FLASH cell.

The voltage swing between the high and the low voltage on the FLASH cell is sensed by the actual sense amplifier, and amplifiers generally perform better with increased voltage differentials on the inputs of the amplifier. In a FLASH design, the sense amplifier may sense the difference between a reference FLASH cell and a FLASH cell to be sensed. The voltage swing has an effect on the difference between the voltages produced by the relatively stable reference FLASH cell and the FLASH cell to be sensed. The voltage produced by the FLASH cell to be sensed may differ more from the voltage produced by the reference FLASH cell.

Figure 1:
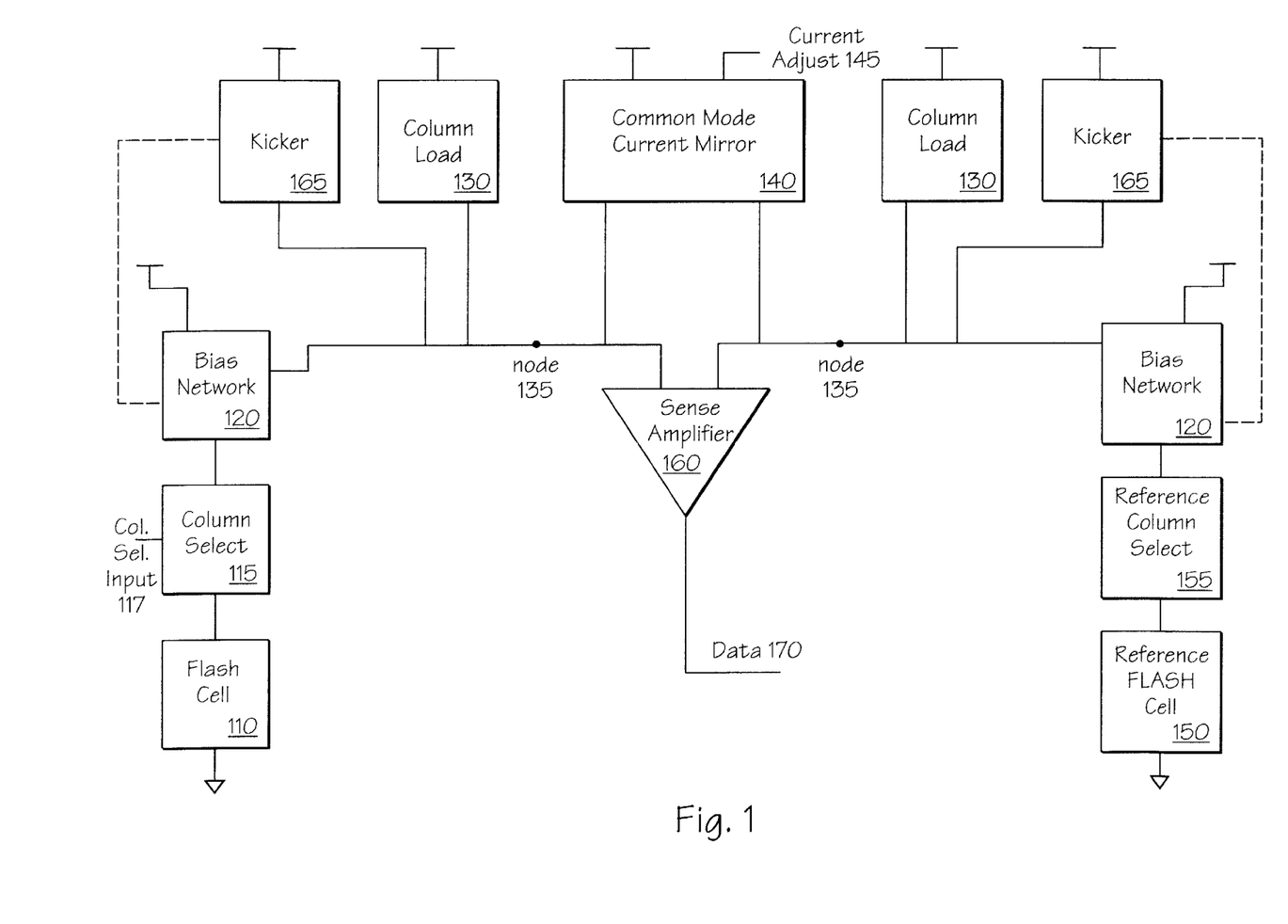
FIG. 1 illustrates an embodiment of a FLASH cell and sensing circuitry.

Illustrated in FIG. 1 is an embodiment of sensing circuitry and a FLASH cell. FLASH cell 110 is coupled to ground and is coupled to column select 115 which has a column select input 117. Coupled to column select 115 is a first bias network 120. Coupled to the first bias network 120 is node 125. Also coupled to node 125 is a first input of sense amplifier 160, a first column load 130, a first kicker 165, and common mode current mirror 140. First kicker 165 may further be coupled to first bias network 120 with a coupling separate from the coupling through node 125. Reference FLASH cell 150 is also coupled to ground and to reference column select 155. Reference column select 155 is coupled in turn to a second bias network 120. Also coupled to the second bias network 120 is node 135. Also coupled to node 135 is a second input of sense amplifier 160, a second column load 130, a second kicker 165, and common mode current mirror 140. Second kicker 165 may further be coupled to second bias network 120 with a coupling separate from the coupling through node 135. Common mode current mirror 140 has coupled to it a current adjust input 145.

First bias network 120 is designed to maintain node 125 at a steady value unless an outside force intervenes. Column select 115, when not selected by column select input 117, cuts off a conducting path to ground and therefore does not disturb the operation of bias network 120. However, when column select 115 is selected (such as when a select signal is applied to column select 115 for example) FLASH cell 110 will potentially form a conducting path to ground and intervene in the operation of bias network 120. In particular, FLASH cell 110 will tend to cause the voltage at node 125 to drop.

Second bias network 120 is also designed to maintain node 135 at a steady value unless an outside force intervenes. However, reference FLASH cell 150 and reference column select 155 are always maintained in a reference state. If that state is one that forms a conducting path to ground, then reference FLASH cell 150 will cause node 135 to change in value, typically causing the voltage at node 135 to drop closer to ground.

In one embodiment, the kicker blocks 165 include circuitry suitable for quickly achieving stability at node 125 and node 135 after a change in state at column select input 117 or a change in state in the overall circuit. Furthermore, the kicker circuitry is designed to automatically shut off once node 125 (or node 135) is close to its steady state voltage. Thus, the kicker blocks may speed up the overall response of the circuitry in FIG. 1 to a change in state.

In one embodiment, both bias networks 120 consume a steady amount of current in the process of keeping node 125 and node 135 at their steady values. Moreover, both FLASH cell 110 and reference FLASH cell 150 may be expected to draw a similar amount of current, and the traditional concept of small and large signal, or signal and bias currents may be introduced in this context. The bias current drawn by both FLASH cell 110 and reference FLASH cell 150 may be supplied by common mode current mirror 140. The signal currents required by either or both of FLASH cell 110 and reference FLASH cell 150 during operation of the circuit may be supplied by the respective column loads 130.

As a result, column loads 130 may be made more resistive than would be reasonable if column loads 130 also supplied the common mode current. Making column loads 130 more resistive in turn allows for a greater voltage drop across column loads 130, which allows greater freedom in the range of voltages at nodes 125 and 135. This greater freedom in the voltage ranges of nodes 125 and 135 then results in greater sensitivity in sense amplifier 160, which leads to faster and less noisy transitions at data 170, the output of sense amplifier 160.

If column loads 130 supplied current to meet the needs of the common mode current, column loads 130 would have to supply that current efficiently to make the circuit cost-effective. This would in turn require a lower resistance value for column loads 130, and would adversely impact the voltage range at nodes 125 and 135.

Figure 2:
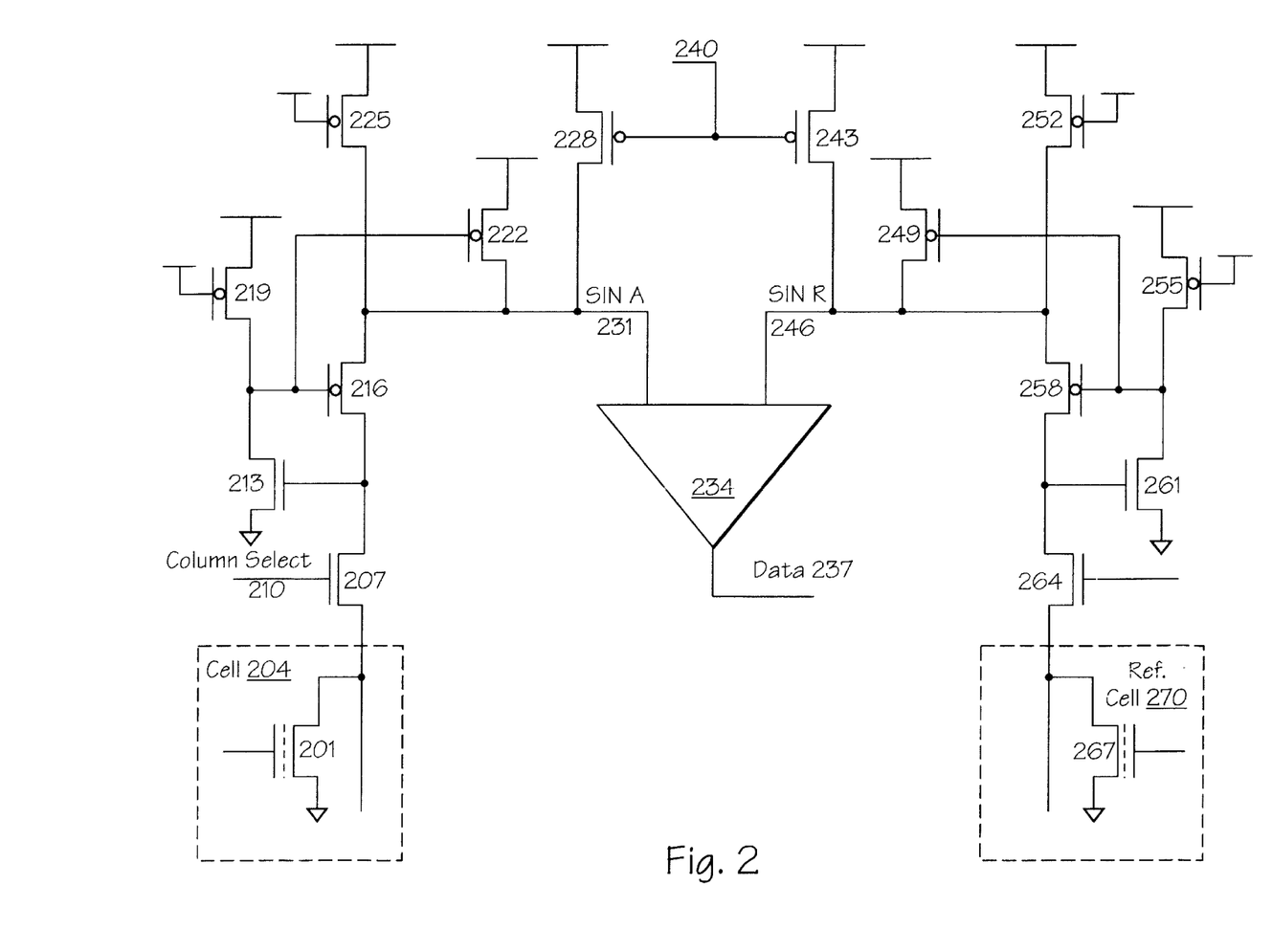
FIG. 2 illustrates an alternate embodiment of a FLASH cell and sensing circuitry.

Turning to FIG. 2, an alternative embodiment of sensing circuitry and a FLASH cell is illustrated. FLASH cell 204 is made up of a floating gate NMOS transistor 201 coupled to ground at its first node and to a first node of column select NMOS transistor 207 at transistor 201's second node. Note that in most MOSFET transistors, a first or second node may be either a source or drain of the transistor, while in bipolar junction transistors the first or second node may be either a collector or emitter. Column select signal 210 is coupled to the gate of transistor 207. The second node of transistor 207 is coupled to the gate of transistor 213 and to the first node of transistor 216. The first node of transistor 213 is coupled to ground, and the second node of transistor 213 is coupled to the gate of transistor 216, the gate of transistor 222, and the first node of transistor 219. The second node of transistor 216 is coupled to the first node of transistor 222 and to the first node of transistor 225, and the node at which this coupling is made is referred to as SINA 231. The gate and the second node of transistor 219 are both coupled to a power supply such as Vcc. Likewise, the gate and the second node of transistor 222 and the gate and the second node of transistor 225 are coupled to a power supply.

Also coupled to the node SINA 231 is the second node of transistor 228 and the first input of sense amplifier 234. Coupled to the first node of transistor 238 and the first node of transistor 243 is a power supply. Coupled to the gate of transistor 228 and the gate of transistor 243 is current adjust input 240. Coupled to the first node of transistor 243 is node SINB 246. Node 246 is also coupled to the second input of sense amplifier 234, the first node of transistor 249, the first node of transistor 252, and the second node of transistor 258. The output of sense amplifier 234 is coupled to data 237.

The second node and gate of transistor 252 are coupled to a power supply, as is the second node of transistor 249. The gate of transistor 249 is coupled to the gate of transistor 258, the first node of transistor 255 and the second node of transistor 261. The first node of transistor 258 is coupled to the gate of transistor 251 and to the second node of transistor 264. The gate and the second node of transistor 255 are coupled to a power supply. The first node of transistor 261 is coupled to ground. The first node of transistor 264 is coupled to the second node of floating gate transistor 267. The first node of floating gate transistor 267 is coupled to ground. Reference cell 270 is formed by floating gate transistor 267, which is preferably programmed to serve as a reference voltage similar to that of a FLASH cell in either a programmed or erased configuration. Alternatively, reference cell 270 may be programmed to serve as a reference voltage nearly midway between a 'programmed' and a 'erased' voltage of a FLASH cell, thereby supplying a trip voltage to sense amplifier 234.

As illustrated in this embodiment, transistor 228 may be adjusted to provide current sufficient to satisfy most of the demand from transistor 216. As a result, transistor 225 may be implemented as the column load for cell 204. Similarly, transistor 243 may provide current sufficient to satisfy most of the demand from transistor 258, thus allowing transistor 252 to act as a column load for reference cell 270.

Figure 3:
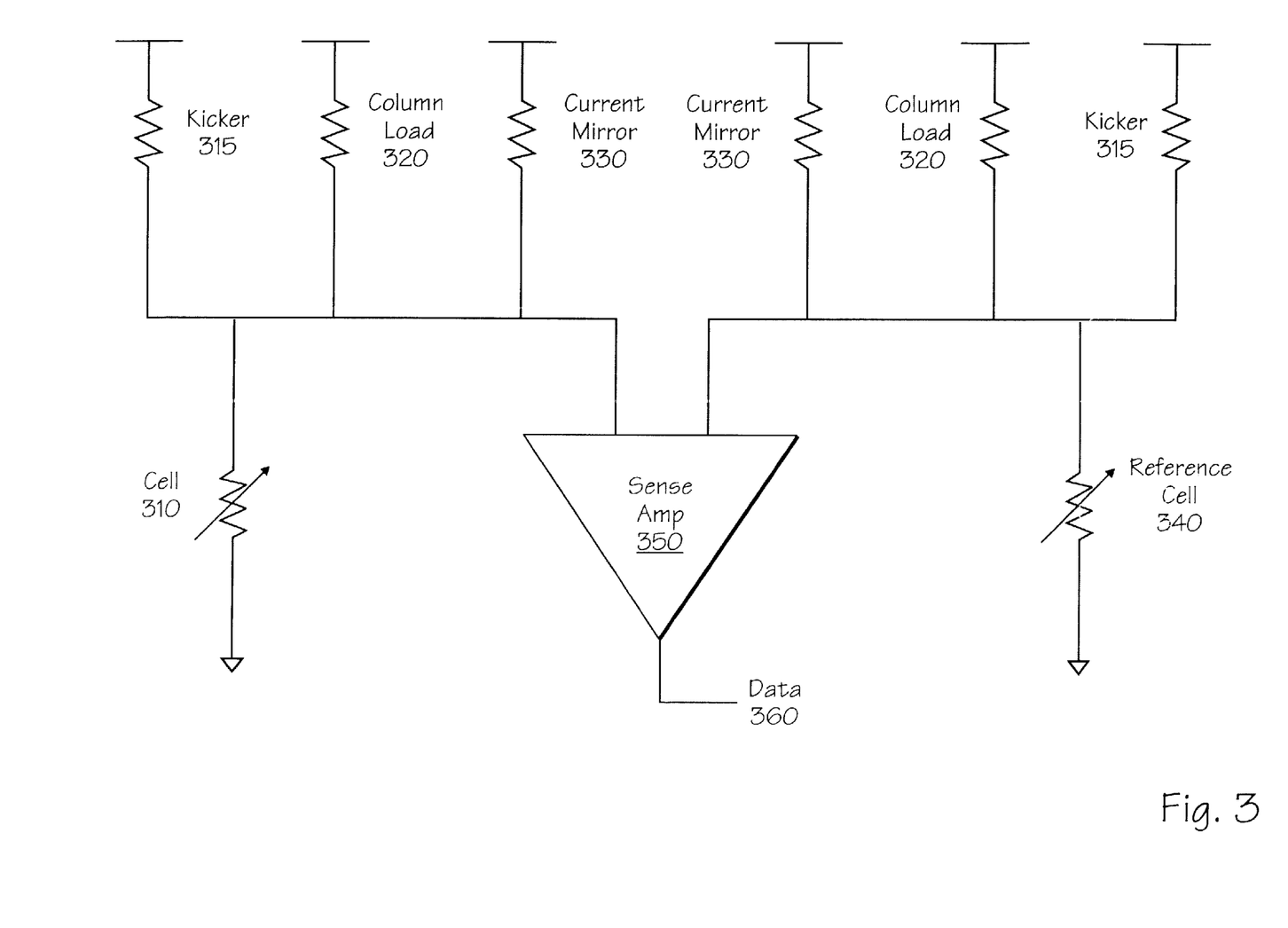
FIG. 3 illustrates another alternative embodiment of a FLASH cell and sensing circuitry.

Illustrated in FIG. 3 is another alternative embodiment of sensing circuitry and a FLASH cell. Cell 310 is represented as an adjustable resistor coupled to ground. Coupled to cell 310 is a first column load 320, a first kicker 315, a first current mirror 330, and a first input of sense amplifier 350. Coupled to first column load 310 is also a power supply, and the power supply is coupled to first current mirror 330 and first kicker 315 as well. Reference cell 340 is similarly represented by an adjustable resistor coupled to ground. Coupled to reference cell 340 is a second input of sense amplifier 350, a second column load 320, a second kicker 315, and a second current mirror 330. Coupled to the output of sense amplifier 350 is data 360.

In one embodiment, current mirrors 330 supply current sufficient to maintain a steady state voltage at the inputs to sense amplifier 350. It will be appreciated that the voltage divider between cell 310 and current mirror 330 in parallel with column load 320 and kicker 315 produces this steady state. When the resistance of cell 310 is adjusted, the current flowing out of first current mirror 330, first kicker 315, and first column load 320 must change to compensate. In one embodiment, current mirrors 330, while represented by resistors, are actually closer to ideal current sources in that they supply the same amount of current at all times. However, the voltage at the first input to sense amplifier 350 may still be adjusted with a change in the resistance of cell 310, and this adjustment may be effected in part by using a high resistance column load 320. With the use of a common-mode current source and a column load resized to primarily support the differential current, the output impedances at nodes SINA 231 and SINR 246 increase. Thus, a small swing in the differential current produces a large swing in voltage at these nodes. This increases sensitivity and speed. Column load 320 with a high resistance causes a large swing in the voltage drop across column load 320 even with a relatively small change in the amount of current required. This large swing may be detected relatively easily by sense amplifier 350 and reflected at its output. In one embodiment, kicker 315 speeds up the process of changing the voltage of the voltage divider without adversely affecting the voltage swing resulting from the resistance of column load 320.

Figure 4:
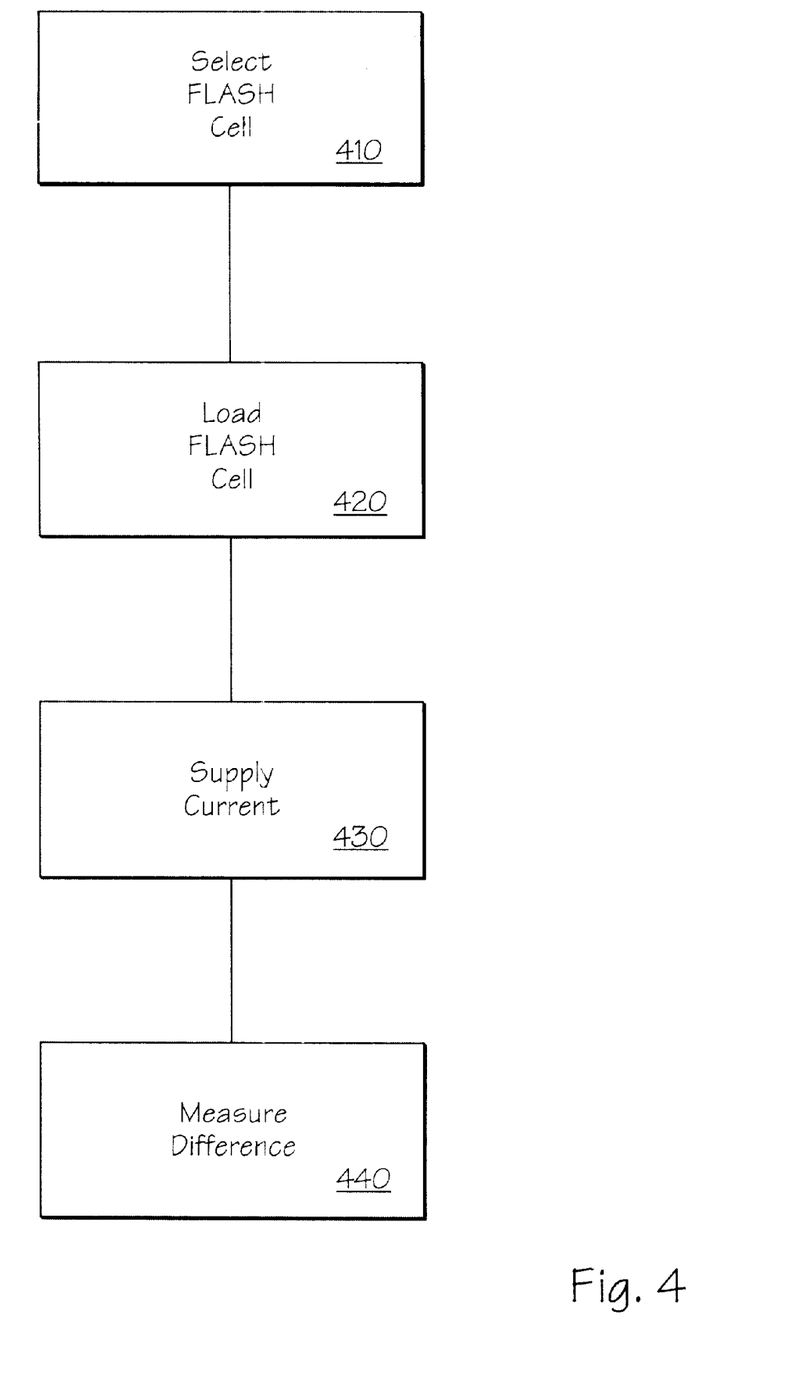
FIG. 4 illustrates an embodiment of a method of operation of a FLASH cell and sensing circuitry.

Turning to FIG. 4, an embodiment of the method of operation of low voltage sensing in flash memories is illustrated. It will be appreciated that the blocks in FIG. 4 are depicted in serial fashion but may actually be implemented in a parallel or simultaneous fashion. In block 410, the FLASH cell is selected, such as by selecting an appropriate column select signal and thereby connecting a FLASH cell to the sensing apparatus. At block 420, the FLASH cell is loaded by the sensing apparatus, such that the FLASH cell will conduct current from the load to ground if it is programmed in a state to conduct. At block 430, current is supplied from the load to the FLASH cell. At block 440, the difference in voltage between the connected FLASH cell and a reference FLASH cell is measured, as by a sense amplifier. It will be appreciated that the measurement is a comparison between a voltage level produced by a reference FLASH cell and a voltage level produced by the selected FLASH cell in one embodiment which may involve measurement of both voltage levels. Furthermore, it will be appreciated that loading the FLASH cell (or the reference FLASH cell) may also include supplying current to the FLASH cell (or reference FLASH cell).

By using a column load in conjunction with a current mirror, the measured difference in voltage may be detected relatively easily, as the voltage swing that occurs when the column load reacts to a change in current may be fairly high.

Figure 5A:
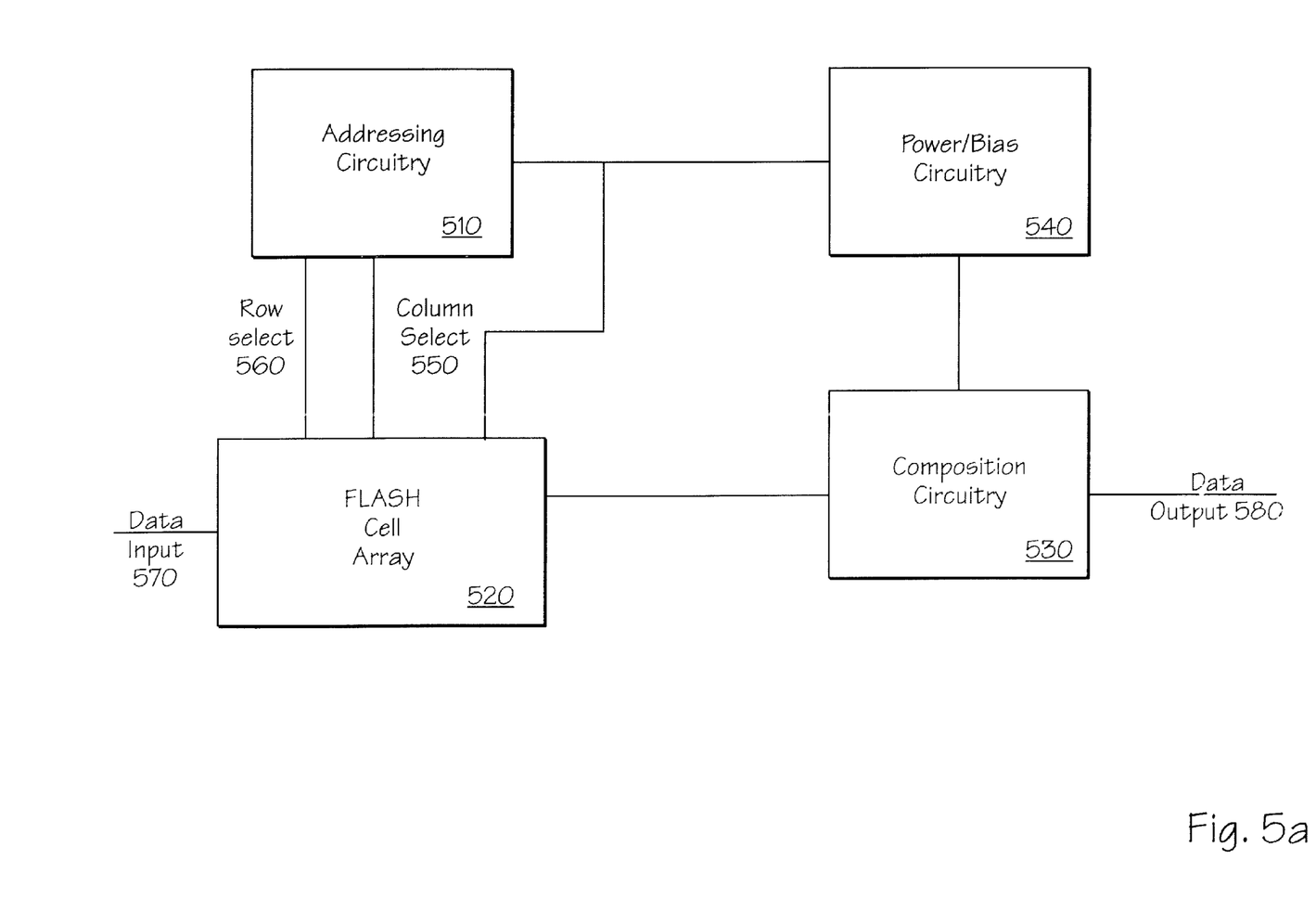
FIG. 5A illustrates an embodiment of a FLASH integrated circuit.

FIG. 5A illustrates an embodiment of a FLASH integrated circuit. Addressing circuitry 510 receives address signals (not shown) and translates those signals into column select 550 and row select 560 (each of which may be implemented as a bus of individual signals in one embodiment). FLASH cell array 520 receives column select 550 and row select 560, and the combination of the two results in selection of a single FLASH cell from the array 520 in one embodiment. FLASH cell array 520 may also receive a data input 570 which is suitable for programming a selected cell. FLASH cell array supplies a signal (voltage/current) to comparison circuitry 530, and the supplied signal is derived from or comes directly from the selected cell. Comparison circuitry receives the signal supplied by FLASH cell array 520, and compares that signal to a reference signal. The comparison results in a data output signal 580 which is generated by comparison circuitry 530. Power and bias circuitry 540 is coupled to each of the other portions of the FLASH integrated circuit, and may supply power and bias voltages and currents. Circuitry 540 may also supply such signals as programming and erase signals as appropriate, and may embody a charge pump for producing voltages greater than a supply voltage of the FLASH integrated circuit.

Figure 5B:
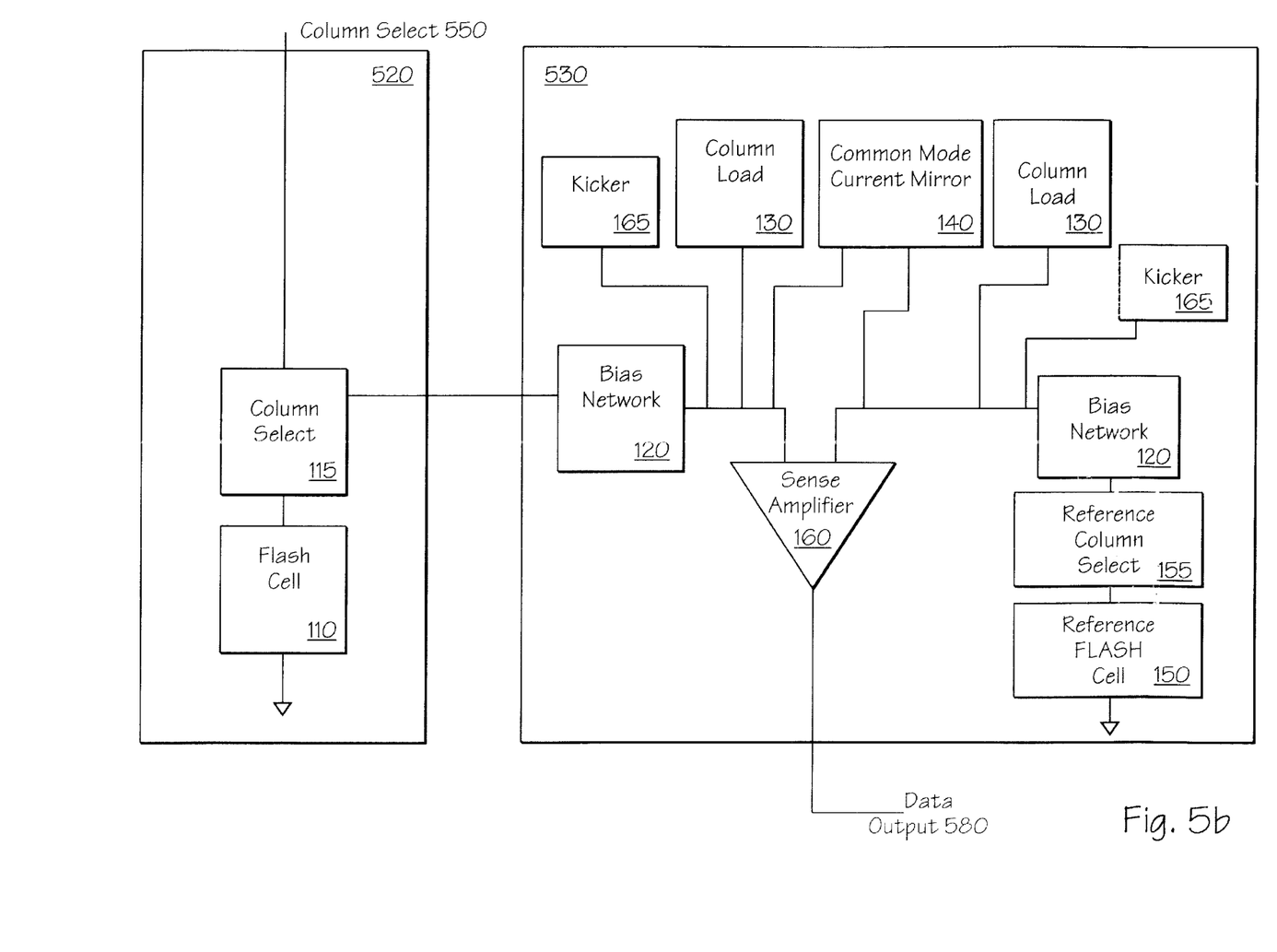
FIG. 5B illustrates a portion of an embodiment of a FLASH integrated circuit.

FIG. 5B further illustrates a portion of an embodiment of a FLASH integrated circuit, and in particular illustrates the relationship in one embodiment between the FLASH integrated circuit of FIG. 5A and the circuitry of FIG. 1.

In the foregoing detailed description, the method and apparatus of the present invention has been described with reference to specific exemplary embodiments thereof. It will, however, be evident that various modifications and changes may be made thereto without departing from the broader spirit and scope of the present invention. In particular, the advantages conferred by the kicker and the common mode current source may be viewed as separate and cumulative, such that neither is necessarily required in a circuit to derive the advantages conferred by the other. Furthermore, it will be appreciated that a device may be coupled to another device in a direct or an indirect manner, such that the first kicker 165 may be said to be coupled both to bias network 120 and to FLASH cell 110. The present specification and figures are accordingly to be regarded as illustrative rather than restrictive.

What is claimed is:

1. An apparatus comprising:

a first column load;

a first current mirror coupled in parallel with the first column load, the first column load capable of being coupled to a FLASH cell and to a sense amplifier;

a first bias circuitry coupled to the first column load and the first current mirror, the first bias circuitry capable of being coupled to the sense amplifier and to the FLASH cell;

a sense amplifier having a first input, the first input coupled to the first column load, the sense amplifier having a second input and an output;

a FLASH cell coupled to the first bias circuitry;

a second column load coupled to the second input of the sense amplifier;

a second current mirror coupled in parallel to the second column load;

a second bias network coupled to the second column load;

a reference FLASH cell coupled to the second bias network;

a column select coupled to the first bias network and coupled to the FLASH cell, the column select disposed between the first bias network and the FLASH cell; and a reference column select coupled to the second bias network and coupled to the reference FLASH cell, the column select disposed between the second bias network and the reference FLASH cell.

2. The apparatus of claim 1 further comprising:

a first kicker coupled in parallel to the first column load; and a second kicker coupled in parallel to the second column load.

3. An apparatus comprising:

a first column load;

a first current mirror coupled in parallel with the first column load, the first column load capable of being coupled to a FLASH cell and to a sense amplifier;

a first bias circuitry coupled to the first column load and the first current mirror, the first bias circuitry capable of being coupled to the sense amplifier and to the FLASH cell;

a sense amplifier having a first input, the first input coupled to the first column load;

a FLASH cell coupled to the first bias circuitry; and a first kicker coupled in parallel to the first column load.

4. The apparatus of claim 3 further comprising:

a column select coupled to the first bias network and coupled to the FLASH cell, the column select disposed between the first bias network and the FLASH cell.

5. The apparatus of claim 4 wherein:

the sense amplifier having a second input and an output; and further comprising:

a second column load coupled to the second input of the sense amplifier;

a second current mirror coupled in parallel to the second column load;

a second bias network coupled to the second column load;

a reference FLASH cell coupled to the second bias network;

a reference column select coupled to the second bias network and coupled to the reference FLASH cell, the column select disposed between the second bias network and the reference FLASH cell; and a second kicker coupled in parallel to the second column load.

6. The apparatus of claim 5 further comprising:

addressing circuitry having a row select signal and a column select signal; and wherein the apparatus comprises:

a comparison circuitry including the first column load, the first current mirror, the first kicker, the first bias circuitry, the second column load, the second current mirror, the second kicker, the second bias circuitry, the sense amplifier, the reference FLASH cell, and the reference column select, the comparison circuitry having a data output coupled to the output of the sense amplifier; and a FLASH cell array having the column select and the FLASH cell, the column select configured to receive the column select signal, the FLASH cell array configured to receive the row select signal.

7. The apparatus of claim 3 further comprising:

addressing circuitry having a row select signal and a column select signal; and wherein the apparatus comprises:

a comparison circuitry including the first column load, the first current mirror, the first kicker, the first bias circuitry, and the sense amplifier; and a FLASH cell array having the column select and the FLASH cell, the column select configured to receive the column select signal, the FLASH cell array configured to receive the row select signal.

8. An apparatus comprising:

a first column load coupled in parallel to a first current source;

a FLASH cell coupled in series with the first column load at a first node;

a sense amplifier having a first input, the first input coupled to the first node;

a second column load coupled in parallel with a second current source, the second current source having a control;

a reference FLASH cell coupled in series with the second column load at a second node;

the sense amplifier having a second input, the second input coupled to the second node;

a first kicker coupled in parallel to the first column load and a second kicker coupled in parallel to the second column load; and wherein the first current source having a control, the control of the first current source coupled to the control of the second current source.

9. The apparatus of claim 8 further comprising:

addressing circuitry having a row select signal and a column select signal;

a FLASH cell array configured to receive the row select signal and the column select signal;

a comparison circuit block having a data output signal; and wherein:

the comparison circuitry including the first kicker, the second kicker, the first column load, the second column load, the first current source, the second current source, the sense amplifier, and the reference FLASH cell; and the FLASH cell array including the FLASH cell.

* * * * *